US008367538B2

(12) United States Patent
Lee

(10) Patent No.: US 8,367,538 B2
(45) Date of Patent: Feb. 5, 2013

(54) PARTITIONED THROUGH-LAYER VIA AND ASSOCIATED SYSTEMS AND METHODS

(75) Inventor: Teck Kheng Lee, Singapore (SG)

(73) Assignee: Micron Technology, Inc., Boise, ID (US)

(*) Notice: Subject to any disclaimer, the term of this patent is extended or adjusted under 35 U.S.C. 154(b) by 133 days.

(21) Appl. No.: 12/898,891

(22) Filed: Oct. 6, 2010

(65) Prior Publication Data
US 2011/0019372 A1  Jan. 27, 2011

Related U.S. Application Data

(62) Division of application No. 11/863,579, filed on Sep. 28, 2007, now Pat. No. 7,830,018.

(30) Foreign Application Priority Data

Aug. 31, 2007 (SG) ................. 200706414-0

(51) Int. Cl.
*H01L 21/44* (2006.01)
(52) U.S. Cl. ............. 438/612; 438/620; 438/622
(58) Field of Classification Search .......... 438/612, 438/620, 622
See application file for complete search history.

(56) References Cited

U.S. PATENT DOCUMENTS

| | | |
|---|---|---|
| 2,821,959 A | 2/1958 | Franz |
| 3,006,318 A | 10/1961 | Monroe, Jr. et al. |
| 3,345,134 A | 10/1967 | Heymer et al. |
| 3,865,298 A | 2/1975 | Allen et al. |
| 3,902,036 A | 8/1975 | Zaleckas |
| 4,040,168 A | 8/1977 | Huang |
| 4,368,106 A | 1/1983 | Anthony |
| 4,534,100 A | 8/1985 | Lane |
| 4,581,301 A | 4/1986 | Michaelson |
| 4,608,480 A | 8/1986 | Bizot et al. |
| 4,614,427 A | 9/1986 | Koizumi et al. |
| 4,627,971 A | 12/1986 | Ayer |
| 4,660,063 A | 4/1987 | Anthony |
| 4,756,765 A | 7/1988 | Woodroffe |
| 4,768,291 A | 9/1988 | Palmer |

(Continued)

FOREIGN PATENT DOCUMENTS

| | | |
|---|---|---|
| DE | 10205026 C1 | 5/2003 |
| EP | 0 127 946 A1 | 12/1984 |

(Continued)

OTHER PUBLICATIONS

Aachboun, S. and P. Ranson, "Cryogenic etching of deep narrow trenches in silicon," J. Vac. Sci. Technol. A 18 (4), Jul./Aug. 2000, pp. 1848-1852.

(Continued)

*Primary Examiner* — Jenny L Wagner
(74) *Attorney, Agent, or Firm* — Perkins Coie LLP

(57) ABSTRACT

Partitioned vias, interconnects, and substrates that include such vias and interconnects are disclosed herein. In one embodiment, a substrate has a non-conductive layer and a partitioned via formed in a portion of the non-conductive layer. The non-conductive layer includes a top side, a bottom side, and a via hole extending between the top and bottom sides and including a sidewall having a first section a second section. The partitioned via includes a first metal interconnect within the via on the first section of the sidewall and a second metal interconnect within the via hole on the second section of the sidewall and electrically isolated from the first metal interconnect. In another embodiment, the first metal interconnect is separated from the second metal interconnect by a gap within the via hole.

14 Claims, 8 Drawing Sheets

U.S. PATENT DOCUMENTS

| | | | |
|---|---|---|---|
| 4,818,728 A | 4/1989 | Rai et al. | |
| 4,907,127 A | 3/1990 | Lee | |
| 4,959,705 A | 9/1990 | Lemnios et al. | |
| 4,964,212 A | 10/1990 | Deroux-Dauphin et al. | |
| 4,984,597 A | 1/1991 | McConnell et al. | |
| 5,024,966 A | 6/1991 | Dietrich et al. | |
| 5,026,964 A | 6/1991 | Somers et al. | |
| 5,027,184 A | 6/1991 | Soclof | |
| 5,037,782 A | 8/1991 | Nakamura et al. | |
| 5,123,902 A | 6/1992 | Muller et al. | |
| 5,145,099 A | 9/1992 | Wood et al. | |
| 5,158,911 A | 10/1992 | Quentin et al. | |
| 5,219,344 A | 6/1993 | Yoder, Jr. | |
| 5,233,448 A | 8/1993 | Wu et al. | |
| 5,237,148 A | 8/1993 | Aoki et al. | |
| 5,289,631 A | 3/1994 | Koopman et al. | |
| 5,292,686 A | 3/1994 | Riley et al. | |
| 5,294,568 A | 3/1994 | McNeilly et al. | |
| 5,304,743 A | 4/1994 | Sen et al. | |
| 5,378,312 A | 1/1995 | Gifford et al. | |
| 5,378,313 A | 1/1995 | Pace | |
| 5,380,681 A | 1/1995 | Hsu et al. | |
| 5,402,435 A | 3/1995 | Shiono et al. | |
| 5,406,630 A | 4/1995 | Piosenka et al. | |
| 5,424,573 A | 6/1995 | Kato et al. | |
| 5,438,212 A | 8/1995 | Okaniwa et al. | |
| 5,447,871 A | 9/1995 | Goldstein | |
| 5,464,960 A | 11/1995 | Hall et al. | |
| 5,481,483 A | 1/1996 | Ebenstein | |
| 5,496,755 A | 3/1996 | Bayraktaroglu | |
| 5,515,167 A | 5/1996 | Ledger et al. | |
| 5,518,956 A | 5/1996 | Liu et al. | |
| 5,585,308 A | 12/1996 | Sardella | |
| 5,585,675 A | 12/1996 | Knopf | |
| 5,614,743 A | 3/1997 | Mochizuki | |
| 5,618,752 A | 4/1997 | Gaul | |
| 5,624,437 A | 4/1997 | Freeman et al. | |
| 5,627,106 A | 5/1997 | Hsu et al. | |
| 5,646,067 A | 7/1997 | Gaul | |
| 5,654,221 A | 8/1997 | Cronin et al. | |
| 5,673,846 A | 10/1997 | Gruber | |
| 5,684,642 A | 11/1997 | Zumoto et al. | |
| 5,690,841 A | 11/1997 | Elderstig et al. | |
| 5,718,791 A | 2/1998 | Spengler et al. | |
| 5,723,904 A | 3/1998 | Shiga | |
| 5,726,493 A | 3/1998 | Yamashita et al. | |
| 5,771,158 A | 6/1998 | Yamagishi et al. | |
| 5,773,359 A | 6/1998 | Mitchell et al. | |
| 5,776,824 A | 7/1998 | Farnworth et al. | |
| 5,807,439 A | 9/1998 | Akatsu et al. | |
| 5,811,799 A | 9/1998 | Wu | |
| 5,821,532 A | 10/1998 | Beaman et al. | |
| 5,825,080 A | 10/1998 | Imaoka et al. | |
| 5,826,628 A | 10/1998 | Hamilton | |
| 5,847,454 A | 12/1998 | Shaw et al. | |
| 5,851,845 A | 12/1998 | Wood et al. | |
| 5,857,963 A | 1/1999 | Pelchy et al. | |
| 5,861,654 A | 1/1999 | Johnson | |
| 5,870,289 A | 2/1999 | Tokuda et al. | |
| 5,870,823 A | 2/1999 | Bezama et al. | |
| 5,893,828 A | 4/1999 | Uram | |
| 5,904,499 A | 5/1999 | Pace | |
| 5,969,422 A | 10/1999 | Ting et al. | |
| 5,998,240 A | 12/1999 | Hamilton et al. | |
| 5,998,292 A | 12/1999 | Black et al. | |
| 6,004,867 A | 12/1999 | Kim et al. | |
| 6,008,070 A | 12/1999 | Farnworth | |
| 6,008,914 A | 12/1999 | Sasagawa et al. | |
| 6,080,291 A | 6/2000 | Woodruff et al. | |
| 6,097,087 A | 8/2000 | Farnworth et al. | |
| 6,103,547 A | 8/2000 | Corisis et al. | |
| 6,107,180 A | 8/2000 | Munroe et al. | |
| 6,107,679 A | 8/2000 | Noguchi | |
| 6,110,825 A | 8/2000 | Mastromatteo et al. | |
| 6,114,240 A | 9/2000 | Akram et al. | |
| 6,119,335 A | 9/2000 | Park et al. | |
| 6,124,634 A | 9/2000 | Akram et al. | |
| 6,130,141 A | 10/2000 | Degani et al. | |
| 6,133,622 A | 10/2000 | Corisis et al. | |
| 6,137,182 A | 10/2000 | Hause et al. | |
| 6,140,604 A | 10/2000 | Somers et al. | |
| 6,143,588 A | 11/2000 | Glenn | |
| 6,148,509 A | 11/2000 | Schoenfeld et al. | |
| 6,159,764 A | 12/2000 | Kinsman et al. | |
| 6,180,518 B1 | 1/2001 | Layadi et al. | |
| 6,184,060 B1 | 2/2001 | Siniaguine | |
| 6,184,465 B1 | 2/2001 | Corisis | |
| 6,187,615 B1 | 2/2001 | Kim et al. | |
| 6,191,487 B1 | 2/2001 | Rodenbeck et al. | |
| 6,203,539 B1 | 3/2001 | Shimmick et al. | |
| 6,221,769 B1 | 4/2001 | Dhong et al. | |
| 6,222,136 B1 | 4/2001 | Appelt et al. | |
| 6,222,270 B1 | 4/2001 | Lee et al. | |
| 6,228,687 B1 | 5/2001 | Akram et al. | |
| 6,229,202 B1 | 5/2001 | Corisis | |
| 6,235,552 B1 | 5/2001 | Kwon et al. | |
| 6,246,108 B1 | 6/2001 | Corisis et al. | |
| 6,252,300 B1 | 6/2001 | Hsuan et al. | |
| 6,268,114 B1 | 7/2001 | Wen et al. | |
| 6,271,580 B1 | 8/2001 | Corisis | |
| 6,277,757 B1 | 8/2001 | Lin | |
| 6,291,894 B1 | 9/2001 | Farnworth et al. | |
| 6,294,837 B1 | 9/2001 | Akram et al. | |
| 6,297,155 B1 | 10/2001 | Simpson et al. | |
| 6,324,253 B1 | 11/2001 | Yuyama et al. | |
| 6,326,689 B1 | 12/2001 | Thomas | |
| 6,326,697 B1 | 12/2001 | Farnworth | |
| 6,329,632 B1 | 12/2001 | Fournier et al. | |
| 6,341,009 B1 | 1/2002 | O'Connor et al. | |
| 6,344,976 B1 | 2/2002 | Schoenfeld et al. | |
| 6,359,254 B1 | 3/2002 | Brown | |
| 6,359,328 B1 | 3/2002 | Dubin | |
| 6,372,548 B2 | 4/2002 | Bessho et al. | |
| 6,388,208 B1 * | 5/2002 | Kiani et al. | 174/266 |
| 6,391,770 B2 | 5/2002 | Kosaki et al. | |
| 6,406,636 B1 | 6/2002 | Vaganov | |
| 6,432,821 B1 | 8/2002 | Dubin et al. | |
| 6,433,303 B1 | 8/2002 | Liu et al. | |
| 6,433,304 B2 | 8/2002 | Okumura et al. | |
| 6,437,284 B1 | 8/2002 | Okamoto et al. | |
| 6,437,441 B1 | 8/2002 | Yamamoto et al. | |
| 6,441,487 B2 | 8/2002 | Elenius et al. | |
| 6,444,576 B1 | 9/2002 | Kong | |
| 6,452,270 B1 | 9/2002 | Huang et al. | |
| 6,457,515 B1 | 10/2002 | Vafai et al. | |
| 6,459,039 B1 | 10/2002 | Bezama et al. | |
| 6,459,150 B1 | 10/2002 | Wu et al. | |
| 6,468,889 B1 | 10/2002 | Iacoponi et al. | |
| 6,486,083 B1 | 11/2002 | Mizuno et al. | |
| 6,486,549 B1 | 11/2002 | Chiang et al. | |
| 6,521,516 B2 | 2/2003 | Monzon et al. | |
| 6,521,530 B2 | 2/2003 | Peters et al. | |
| 6,534,192 B1 | 3/2003 | Abys et al. | |
| 6,534,863 B2 | 3/2003 | Walker et al. | |
| 6,545,563 B1 | 4/2003 | Smith | |
| 6,555,782 B2 | 4/2003 | Isaji et al. | |
| 6,560,047 B2 | 5/2003 | Choi et al. | |
| 6,569,711 B1 | 5/2003 | Susko et al. | |
| 6,569,777 B1 | 5/2003 | Hsu et al. | |
| 6,572,606 B2 | 6/2003 | Kliewer et al. | |
| 6,576,531 B2 | 6/2003 | Peng et al. | |
| 6,580,174 B2 | 6/2003 | McCormick et al. | |
| 6,582,987 B2 | 6/2003 | Jun et al. | |
| 6,582,992 B2 | 6/2003 | Poo et al. | |
| 6,593,644 B2 | 7/2003 | Chiu et al. | |
| 6,599,436 B1 | 7/2003 | Matzke et al. | |
| 6,606,251 B1 | 8/2003 | Kenny, Jr. et al. | |
| 6,614,033 B2 | 9/2003 | Suguro et al. | |
| 6,620,031 B2 | 9/2003 | Renteln | |
| 6,620,731 B1 | 9/2003 | Farnworth et al. | |
| 6,621,045 B1 | 9/2003 | Liu et al. | |
| 6,638,410 B2 | 10/2003 | Chen et al. | |
| 6,653,236 B2 | 11/2003 | Wai et al. | |
| 6,658,818 B2 | 12/2003 | Kurth et al. | |
| 6,660,622 B2 | 12/2003 | Chen et al. | |
| 6,660,630 B1 | 12/2003 | Chang et al. | |
| 6,664,129 B2 | 12/2003 | Siniaguine | |

| | | | | | | |
|---|---|---|---|---|---|---|
| 6,664,485 B2 | 12/2003 | Bhatt et al. | | 7,265,052 B2 | 9/2007 | Sinha |
| 6,667,551 B2 | 12/2003 | Hanaoka et al. | | 7,271,482 B2 | 9/2007 | Kirby |
| 6,680,459 B2 | 1/2004 | Kanaya et al. | | 7,279,776 B2 | 10/2007 | Morimoto |
| 6,699,787 B2 | 3/2004 | Mashino et al. | | 7,300,857 B2 | 11/2007 | Akram et al. |
| 6,703,310 B2 | 3/2004 | Mashino et al. | | 7,317,256 B2 | 1/2008 | Williams et al. |
| 6,708,405 B2 | 3/2004 | Hasler et al. | | 7,491,582 B2 | 2/2009 | Yokoyama et al. |
| 6,746,971 B1 | 6/2004 | Ngo et al. | | 7,498,661 B2 | 3/2009 | Matsuo |
| 6,750,144 B2 | 6/2004 | Taylor | | 2001/0020739 A1 | 9/2001 | Honda |
| 6,756,564 B2 | 6/2004 | Tian | | 2002/0005583 A1 | 1/2002 | Harada et al. |
| 6,770,958 B2 | 8/2004 | Wang et al. | | 2002/0020898 A1 | 2/2002 | Vu et al. |
| 6,774,486 B2 | 8/2004 | Kinsman | | 2002/0027293 A1 | 3/2002 | Hoshino |
| 6,777,244 B2 | 8/2004 | Pepper et al. | | 2002/0057468 A1 | 5/2002 | Segawa et al. |
| 6,780,749 B2 | 8/2004 | Masumoto et al. | | 2002/0059722 A1 | 5/2002 | Murakami |
| 6,790,775 B2 | 9/2004 | Fartash | | 2002/0060208 A1 | 5/2002 | Liu et al. |
| 6,797,616 B2 | 9/2004 | Kinsman | | 2002/0094607 A1 | 7/2002 | Gebauer et al. |
| 6,809,025 B2 | 10/2004 | Sandhu et al. | | 2002/0096729 A1 | 7/2002 | Tu et al. |
| 6,809,421 B1 | 10/2004 | Hayasaka et al. | | 2002/0130390 A1 | 9/2002 | Ker et al. |
| 6,818,464 B2 | 11/2004 | Heschel et al. | | 2002/0190371 A1 | 12/2002 | Mashino et al. |
| 6,825,127 B2 | 11/2004 | Ouellet et al. | | 2003/0014895 A1 | 1/2003 | Lizotte |
| 6,825,557 B2 | 11/2004 | DiBattista et al. | | 2003/0042564 A1 | 3/2003 | Taniguchi et al. |
| 6,828,175 B2 | 12/2004 | Wood et al. | | 2003/0045085 A1 | 3/2003 | Taniguchi et al. |
| 6,828,223 B2 | 12/2004 | Chuang | | 2003/0119308 A1 | 6/2003 | Geefay et al. |
| 6,838,377 B2 | 1/2005 | Tonami et al. | | 2003/0148597 A1 | 8/2003 | Tan et al. |
| 6,841,849 B2 | 1/2005 | Miyazawa | | 2003/0216023 A1 | 11/2003 | Wark et al. |
| 6,852,621 B2 | 2/2005 | Hanaoka et al. | | 2004/0004280 A1 | 1/2004 | Shibata |
| 6,856,023 B2 | 2/2005 | Muta et al. | | 2004/0016942 A1 | 1/2004 | Miyazawa et al. |
| 6,858,891 B2 | 2/2005 | Farnworth et al. | | 2004/0018712 A1 | 1/2004 | Plas et al. |
| 6,864,172 B2 | 3/2005 | Noma et al. | | 2004/0023447 A1 | 2/2004 | Hirakata et al. |
| 6,864,457 B1 | 3/2005 | Alexander et al. | | 2004/0041261 A1 | 3/2004 | Kinsman |
| 6,867,390 B2 | 3/2005 | Clauer et al. | | 2004/0043607 A1 | 3/2004 | Farnworth et al. |
| 6,873,054 B2 | 3/2005 | Miyazawa et al. | | 2004/0046251 A1 | 3/2004 | Lee |
| 6,882,030 B2 | 4/2005 | Siniaguine | | 2004/0073607 A1 | 4/2004 | Su et al. |
| 6,885,107 B2 | 4/2005 | Kinsman | | 2004/0087441 A1 | 5/2004 | Bock et al. |
| 6,903,012 B2 | 6/2005 | Geefay et al. | | 2004/0094389 A1 | 5/2004 | Boyce |
| 6,903,442 B2 | 6/2005 | Wood et al. | | 2004/0137661 A1 | 7/2004 | Murayama |
| 6,903,443 B2 | 6/2005 | Farnworth et al. | | 2004/0137701 A1 | 7/2004 | Takao |
| 6,910,268 B2 | 6/2005 | Miller | | 2004/0141536 A1 | 7/2004 | Liu et al. |
| 6,913,952 B2 | 7/2005 | Moxham et al. | | 2004/0159668 A1 | 8/2004 | Vasiadis |
| 6,916,725 B2 | 7/2005 | Yamaguchi | | 2004/0159958 A1 | 8/2004 | Funaki |
| 6,936,536 B2 | 8/2005 | Sinha | | 2004/0178491 A1 | 9/2004 | Akram et al. |
| 6,939,343 B2 | 9/2005 | Sumiya | | 2004/0180539 A1 | 9/2004 | Yamamoto et al. |
| 6,943,056 B2 | 9/2005 | Nemoto et al. | | 2004/0188260 A1 | 9/2004 | Bonkabeta et al. |
| 6,946,325 B2 | 9/2005 | Yean et al. | | 2004/0192033 A1 | 9/2004 | Hara |
| 6,951,627 B2 | 10/2005 | Li et al. | | 2004/0198033 A1 | 10/2004 | Lee et al. |
| 6,953,748 B2 | 10/2005 | Yamaguchi | | 2004/0198040 A1 | 10/2004 | Geefay et al. |
| 6,962,867 B2 | 11/2005 | Jackson et al. | | 2004/0219342 A1 | 11/2004 | Boggs et al. |
| 6,970,775 B2 | 11/2005 | Lederle et al. | | 2004/0219763 A1 | 11/2004 | Kim et al. |
| 6,982,487 B2 | 1/2006 | Kim et al. | | 2004/0222082 A1 | 11/2004 | Gopalraja et al. |
| 7,022,609 B2 | 4/2006 | Yamamoto et al. | | 2004/0245649 A1 | 12/2004 | Imaoka |
| 7,023,090 B2 | 4/2006 | Huang et al. | | 2004/0255258 A1 | 12/2004 | Li |
| 7,029,937 B2 | 4/2006 | Miyazawa et al. | | 2004/0262753 A1 | 12/2004 | Kashiwazaki |
| 7,033,927 B2 | 4/2006 | Cohen et al. | | 2005/0026443 A1 | 2/2005 | Goo et al. |
| 7,037,836 B2 | 5/2006 | Lee | | 2005/0037608 A1 | 2/2005 | Andricacos et al. |
| 7,041,598 B2 | 5/2006 | Sharma | | 2005/0046002 A1 | 3/2005 | Lee et al. |
| 7,045,015 B2 | 5/2006 | Renn et al. | | 2005/0064707 A1 | 3/2005 | Sinha |
| 7,083,425 B2 | 8/2006 | Chong et al. | | 2005/0067620 A1 | 3/2005 | Chan et al. |
| 7,084,073 B2 | 8/2006 | Lee et al. | | 2005/0069782 A1 | 3/2005 | Elenius et al. |
| 7,091,124 B2 | 8/2006 | Rigg et al. | | 2005/0101054 A1 | 5/2005 | Mastromatteo et al. |
| 7,092,284 B2 | 8/2006 | Braun et al. | | 2005/0101116 A1 | 5/2005 | Tseng |
| 7,094,677 B2 | 8/2006 | Yamamoto et al. | | 2005/0104228 A1 | 5/2005 | Rigg et al. |
| 7,109,068 B2 | 9/2006 | Akram et al. | | 2005/0106834 A1 | 5/2005 | Andry et al. |
| 7,129,112 B2 | 10/2006 | Matsuo | | 2005/0110095 A1 | 5/2005 | Shih et al. |
| 7,151,009 B2 | 12/2006 | Kim et al. | | 2005/0110889 A1 | 5/2005 | Tuttle et al. |
| 7,164,565 B2 | 1/2007 | Takeda | | 2005/0127478 A1 | 6/2005 | Hiatt et al. |
| 7,166,247 B2 | 1/2007 | Kramer | | 2005/0136646 A1 | 6/2005 | Larnerd et al. |
| 7,170,183 B1 | 1/2007 | Kim et al. | | 2005/0139390 A1 | 6/2005 | Kim et al. |
| 7,183,176 B2 | 2/2007 | Sankarapillai et al. | | 2005/0150683 A1* | 7/2005 | Farnworth et al. ............ 174/255 |
| 7,183,653 B2 | 2/2007 | Myers et al. | | 2005/0151228 A1 | 7/2005 | Tanida et al. |
| 7,186,650 B1 | 3/2007 | Dakshina-Murthy | | 2005/0164500 A1 | 7/2005 | Lindgren |
| 7,190,061 B2 | 3/2007 | Lee et al. | | 2005/0184219 A1 | 8/2005 | Kirby |
| 7,199,050 B2 | 4/2007 | Hiatt | | 2005/0191861 A1 | 9/2005 | Verhaverbeke |
| 7,214,615 B2 | 5/2007 | Miyazawa | | 2005/0194169 A1 | 9/2005 | Tonomura |
| 7,217,596 B2 | 5/2007 | Cobbley et al. | | 2005/0208766 A1 | 9/2005 | Kirby et al. |
| 7,217,888 B2 | 5/2007 | Sunohara et al. | | 2005/0227382 A1 | 10/2005 | Hui |
| 7,223,634 B2 | 5/2007 | Yamaguchi | | 2005/0231626 A1 | 10/2005 | Tuttle et al. |
| 7,232,754 B2 | 6/2007 | Kirby et al. | | 2005/0236708 A1 | 10/2005 | Farnworth et al. |
| 7,256,073 B2 | 8/2007 | Noma et al. | | 2005/0247894 A1 | 11/2005 | Watkins et al. |
| 7,262,134 B2 | 8/2007 | Kirby et al. | | 2005/0253213 A1 | 11/2005 | Jiang et al. |
| 7,262,495 B2 | 8/2007 | Chen et al. | | 2005/0254133 A1 | 11/2005 | Akram et al. |

| | | | |
|---|---|---|---|
| 2005/0258530 A1 | 11/2005 | Vindasius et al. | |
| 2005/0272221 A1 | 12/2005 | Yen et al. | |
| 2005/0275048 A1 | 12/2005 | Farnworth et al. | |
| 2005/0275049 A1 | 12/2005 | Kirby et al. | |
| 2005/0275051 A1 | 12/2005 | Farnworth et al. | |
| 2005/0275750 A1 | 12/2005 | Akram et al. | |
| 2005/0277293 A1 | 12/2005 | Kim et al. | |
| 2005/0282374 A1 | 12/2005 | Hwang et al. | |
| 2005/0285154 A1 | 12/2005 | Akram et al. | |
| 2006/0003566 A1 | 1/2006 | Emesh | |
| 2006/0011809 A1 | 1/2006 | Farnworth et al. | |
| 2006/0014313 A1 | 1/2006 | Hall et al. | |
| 2006/0023107 A1 | 2/2006 | Bolken et al. | |
| 2006/0024856 A1 | 2/2006 | Derderian et al. | |
| 2006/0035402 A1 | 2/2006 | Street et al. | |
| 2006/0035415 A1 | 2/2006 | Wood et al. | |
| 2006/0038183 A1 | 2/2006 | Oliver | |
| 2006/0038272 A1 | 2/2006 | Edwards | |
| 2006/0040421 A1 | 2/2006 | Farnworth et al. | |
| 2006/0040428 A1 | 2/2006 | Johnson | |
| 2006/0042952 A1 | 3/2006 | Oliver et al. | |
| 2006/0043262 A1 | 3/2006 | Akram | |
| 2006/0043509 A1 | 3/2006 | Watkins et al. | |
| 2006/0043512 A1 | 3/2006 | Oliver et al. | |
| 2006/0043569 A1 | 3/2006 | Benson et al. | |
| 2006/0044433 A1 | 3/2006 | Akram | |
| 2006/0046332 A1 | 3/2006 | Derderian et al. | |
| 2006/0046438 A1 | 3/2006 | Kirby | |
| 2006/0046468 A1 | 3/2006 | Akram et al. | |
| 2006/0046471 A1 | 3/2006 | Kirby et al. | |
| 2006/0057776 A1 | 3/2006 | Tao | |
| 2006/0057836 A1 | 3/2006 | Nagarajan et al. | |
| 2006/0071347 A1 | 4/2006 | Dotta | |
| 2006/0148250 A1 | 7/2006 | Kirby | |
| 2006/0151880 A1 | 7/2006 | Tang et al. | |
| 2006/0154153 A1 | 7/2006 | Chiang et al. | |
| 2006/0160367 A1 | 7/2006 | Wai et al. | |
| 2006/0177959 A1 | 8/2006 | Boettiger et al. | |
| 2006/0177999 A1 | 8/2006 | Hembree et al. | |
| 2006/0180941 A1 | 8/2006 | Kirby et al. | |
| 2006/0186097 A1 | 8/2006 | Watkins et al. | |
| 2006/0186492 A1 | 8/2006 | Boettiger et al. | |
| 2006/0191882 A1 | 8/2006 | Watkins et al. | |
| 2006/0195729 A1 | 8/2006 | Huppenthal et al. | |
| 2006/0199363 A1 | 9/2006 | Kirby et al. | |
| 2006/0204651 A1 | 9/2006 | Wai et al. | |
| 2006/0208360 A1 | 9/2006 | Yiu et al. | |
| 2006/0216862 A1 | 9/2006 | Rigg et al. | |
| 2006/0223301 A1 | 10/2006 | Vanhaelemeersch et al. | |
| 2006/0249849 A1 | 11/2006 | Cohen | |
| 2006/0252254 A1 | 11/2006 | Basol | |
| 2006/0252262 A1 | 11/2006 | Kazemi | |
| 2006/0255443 A1 | 11/2006 | Hwang et al. | |
| 2006/0264041 A1 | 11/2006 | Rigg et al. | |
| 2006/0270108 A1 | 11/2006 | Farnworth et al. | |
| 2006/0278979 A1 | 12/2006 | Rangel | |
| 2006/0278980 A1 | 12/2006 | Trezza et al. | |
| 2006/0278988 A1 | 12/2006 | Trezza et al. | |
| 2006/0278989 A1 | 12/2006 | Trezza | |
| 2006/0281224 A1 | 12/2006 | Edelstein et al. | |
| 2006/0281243 A1 | 12/2006 | Trezza | |
| 2006/0289967 A1 | 12/2006 | Heck et al. | |
| 2006/0289968 A1 | 12/2006 | Sulfridge | |
| 2006/0290001 A1 | 12/2006 | Sulfridge | |
| 2006/0292877 A1 | 12/2006 | Lake | |
| 2007/0004079 A1 | 1/2007 | Geefay et al. | |
| 2007/0012655 A1 | 1/2007 | Kwon et al. | |
| 2007/0020805 A1 | 1/2007 | Kim et al. | |
| 2007/0020935 A1 | 1/2007 | Taylor et al. | |
| 2007/0023121 A1 | 2/2007 | Jones et al. | |
| 2007/0032061 A1 | 2/2007 | Farnworth et al. | |
| 2007/0035033 A1 | 2/2007 | Ozguz et al. | |
| 2007/0037379 A1 | 2/2007 | Enquist et al. | |
| 2007/0042598 A1 | 2/2007 | Park | |
| 2007/0045120 A1 | 3/2007 | Tiwari et al. | |
| 2007/0045388 A1 | 3/2007 | Farnworth et al. | |
| 2007/0045515 A1 | 3/2007 | Farnworth et al. | |
| 2007/0045632 A1 | 3/2007 | Oliver et al. | |
| 2007/0045779 A1 | 3/2007 | Hiatt | |
| 2007/0045806 A1 | 3/2007 | Hsuan | |
| 2007/0045812 A1 | 3/2007 | Heng | |
| 2007/0045826 A1 | 3/2007 | Lee et al. | |
| 2007/0045834 A1 | 3/2007 | Chong et al. | |
| 2007/0048896 A1 | 3/2007 | Andry et al. | |
| 2007/0048994 A1 | 3/2007 | Tuttle | |
| 2007/0049016 A1 | 3/2007 | Hiatt et al. | |
| 2007/0049019 A1 | 3/2007 | Wai et al. | |
| 2007/0057028 A1 | 3/2007 | Lake et al. | |
| 2007/0077753 A1 | 4/2007 | Iwatake et al. | |
| 2007/0082427 A1 | 4/2007 | Shirahama et al. | |
| 2007/0096263 A1 | 5/2007 | Furukawa et al. | |
| 2007/0099395 A1 | 5/2007 | Sridhar et al. | |
| 2007/0111386 A1 | 5/2007 | Kim et al. | |
| 2007/0122940 A1 | 5/2007 | Gautham | |
| 2007/0138562 A1 | 6/2007 | Trezza | |
| 2007/0145563 A1 | 6/2007 | Punzalan et al. | |
| 2007/0152342 A1 | 7/2007 | Tsao et al. | |
| 2007/0155997 A1 | 7/2007 | Li et al. | |
| 2007/0158839 A1 | 7/2007 | Trezza | |
| 2007/0158853 A1 | 7/2007 | Sinha | |
| 2007/0161235 A1 | 7/2007 | Trezza | |
| 2007/0166991 A1 | 7/2007 | Sinha | |
| 2007/0166997 A1 | 7/2007 | Knorr | |
| 2007/0167004 A1 | 7/2007 | Trezza | |
| 2007/0170574 A1 | 7/2007 | Lauxtermann et al. | |
| 2007/0178694 A1 | 8/2007 | Hiatt | |
| 2007/0182020 A1 | 8/2007 | Trezza et al. | |
| 2007/0190803 A1 | 8/2007 | Singh et al. | |
| 2007/0197013 A1 | 8/2007 | Trezza | |
| 2007/0202617 A1 | 8/2007 | Hembree | |
| 2007/0222050 A1 | 9/2007 | Lee et al. | |
| 2007/0222054 A1 | 9/2007 | Hembree | |
| 2007/0228576 A1 | 10/2007 | Trezza | |
| 2007/0228926 A1 | 10/2007 | Teo et al. | |
| 2007/0262424 A1 | 11/2007 | Hiatt | |
| 2007/0267138 A1 | 11/2007 | White et al. | |
| 2007/0281473 A1 | 12/2007 | Clark et al. | |
| 2007/0293040 A1 | 12/2007 | Emesh et al. | |
| 2008/0006850 A1 | 1/2008 | Ribnicek et al. | |
| 2008/0050904 A1 | 2/2008 | Lake | |
| 2008/0050911 A1 | 2/2008 | Borthakur | |
| 2008/0054444 A1 | 3/2008 | Tuttle | |
| 2008/0057620 A1 | 3/2008 | Pratt | |
| 2008/0079120 A1 | 4/2008 | Foster et al. | |
| 2008/0079121 A1 | 4/2008 | Han | |
| 2008/0081386 A1 | 4/2008 | Raravikar et al. | |
| 2008/0081398 A1 | 4/2008 | Lee et al. | |
| 2008/0237881 A1 | 10/2008 | Dambrauskas et al. | |
| 2008/0265933 A1 | 10/2008 | Tanioka et al. | |
| 2009/0007934 A1 | 1/2009 | Hutto | |
| 2009/0014859 A1 | 1/2009 | Jeung et al. | |
| 2009/0057912 A1 | 3/2009 | Kheng | |
| 2009/0146312 A1 | 6/2009 | Sulfridge | |
| 2009/0166846 A1 | 7/2009 | Pratt et al. | |
| 2009/0305502 A1 | 12/2009 | Lee et al. | |

FOREIGN PATENT DOCUMENTS

| | | |
|---|---|---|
| EP | 1154474 A1 | 11/2001 |
| EP | 1415950 A2 | 5/2004 |
| JP | 63052432 A | 3/1988 |
| JP | 01252308 A | 10/1989 |
| JP | 02235589 A | 9/1990 |
| JP | 05104316 A | 4/1993 |
| JP | 2001077496 A | 3/2001 |
| JP | 2001082931 A | 3/2001 |
| JP | 2001298147 A | 10/2001 |
| JP | 2002018585 A | 1/2002 |
| JP | 2005093980 A | 4/2005 |
| JP | 2005310817 A | 11/2005 |
| KR | 20010018694 A | 3/2001 |
| KR | 20020022122 A | 3/2002 |
| KR | 20020061812 A | 7/2002 |
| KR | 100733467 B1 | 6/2007 |
| TW | 250597 B | 3/2006 |
| WO | 03065450 A2 | 8/2003 |
| WO | 2004109770 A2 | 12/2004 |
| WO | 2005022965 A2 | 3/2005 |
| WO | 2005036940 A1 | 4/2005 |

| | | |
|---|---|---|
| WO | 2006053036 A2 | 5/2006 |
| WO | 2006124597 A2 | 11/2006 |
| WO | 2007025812 A1 | 3/2007 |
| WO | 2007043718 A1 | 4/2007 |

OTHER PUBLICATIONS

Aachboun, S. and P. Ranson, "Deep anisotropic etching of silicon," J. Vac. Sci. Technol. A 17(4), Jul./Aug. 1999, pp. 2270-2273.

Amazawa, T. et al., "Planarized Multilevel Interconnection Using Chemical Mechanical Polishing of Selective CVD-Al Via Plugs," IEEE Transactions on Electron Devices, vol. 45, No. 4, pp. 815-820, Apr. 1998.

Armacost, M. et al., "Plasma-Etching Processes for ULSI Semiconductor Circuits," IBM J. Res. Develop., vol. 43, No. 1/2, pp. 39-72, Jan./Mar. 1999, <http://www.research.ibm.com/journal/rd/431/armacost.pdf>.

Arunasalam, P. et al., "Thermo-Mechanical Analysis of Thru-Silicon-Via Based High Density Compliant Interconnect," Electronic Components and Technology Conference, 2007, ECTC '07, Proceedings, 57th, May 29, 2007-Jun. 1, 2007, pp. 1179-1185.

Bernstein, K. et al., "Interconnects in the Third Dimension: Design Challenges for 3D ICs," Design Automation Conference, 2007, DAC '07, 44th ACM/IEEE, Jun. 4-8, 2007, pp. 562-567.

Blackburn, J.M. et al., "Deposition of Conformal Copper and Nickel Films from Supercritical Carbon Dioxide," Science, vol. 94, Oct. 2001, pp. 141-145.

Cheung, T.S.D. et al., "On-Chip Interconnect for mm-Wave Applications Using an All-Copper Technology and Wavelength Reduction," 2003 IEEE International Solid-State Circuits Conference.

Chou, Bill et al., "Ultra Via Substrate for Advanced BGA Applications," Pan Pacific Symposium, Jan. 25, 2000, <http://www.smta.org/files/PanPac00-ChouBill.pdf>.

De Boer, M.J. et al., "Micromachining of Buried Micro Channels in Silicon," Journal of Microelectromechanical Systems, vol. 9, No. 1, Mar. 2000, IEEE, ISSN: 1057-7157.

Gutmann, R.J., "Wafer-Level Three-Dimensional Monolithic Integration for Heterogeneous Silicon ICs," 2004 Topical Meeting on Silicon Monolithic Integrated Circuits in RF Systems, IEEE, Sep. 8-10, 2004, pp. 45-48.

Hirafune, S. et al., "Packaging Technology for Imager Using Through-hole Interconnection in Si Substrate," Proceeding of HDP'04, IEEE, pp. 303-306, Jul. 2004.

Jang, D.M. et al., "Development and Evaluation of 3-D SiP with Vertically Interconnected Through Silicon Vias (TSV)," Proceedings of the 57th Electronic Components and Technology Conference, IEEE, May 29, 2007-Jun. 1, 2007, pp. 847-852, ISBN: 1-4244-0985-3.

Kada, M. et al., "Advancements in Stacked Chip Scale Packaging (S-CSP) Provides System-in-a-Package Functionality for Wireless and Handheld Applications," Future Fab Intl., vol. 9, Jan. 7, 2000.

Keigler, A. et al., "Enabling 3-D Design," Semiconductor International, Aug. 2007.

Kim, J.Y. et al., "S-RCAT (Sphere-shaped-Recess-Channel-Array Transistor) Technology for 70nm DRAM Feature Size and Beyond," 2005 Symposium on VLSI Technology, Digest of Technical Papers, Jun. 14-16, 2005, pp. 34-35, IEEE, ISBN: 4-900784-02-8.

Kuhn, Markus and Jose A. Rodriguez, "Adsorption of sulfur on bimetallic surfaces: Formation of copper sulfides on Pt (111) and Ru(001)," J. Vac. Sci. Technol. A 13(3), pp. 1569-1573, May/Jun. 1995.

Kurita, Y. et al., "A 3D Stacked Memory Integrated on a Logic Device Using SMAFTI Technology," 2007 IEEE Electronic Components and Technology Conference, pp. 821-829, May 29-Jun. 1, 2007, ISBN 1-4244-0985-3.

Kyocera Corporation, Memory Package, 1 page, retrieved from the Internet on Dec. 3, 2004, <http://global.kyocera.com/prdct/semicon/ic_pkg/memory_p.html>.

Lee, H.M. et al., Abstract of "Abatement of Sulfur Hexaflouride Emissions from the Semiconductor Manufacturing Process by Atmospheric-Pressure Plasmas," 1 page, Aug. 2004, <http:www.awma.org/journal/ShowAbstract.asp?Year=&PaperID=1256>.

Lee, R.A. et al., "Laser Created Silicon Vias for Stacking Dies in MCMs," IEEE/CHMT IEMT Symposium, 1991, pp. 262-265.

Lee, T.K. et al., "A Novel Joint-in-Via Flip-Chip Chip-Scale Package," IEEE Transactions on Advanced Packaging, vol. 29, No. 1, pp. 186-194, Feb. 2006.

Moffat, T.P., et al. "Superconformal film growth; Mechanism and quantification," IBM J. Res. & Dev., vol. 49, No. 1, pp. 19-36, Jan. 2005.

Morrow, P.R. et al., "Three-Dimensional Wafer Stacking Via Cu-Cu Bonding Integrated With 65-nm Strained-Si/Low-k CMOS Technology," IEEE Electron Device Letters, vol. 27, No. 5, pp. 335-337, May 2006, ISBN: 0741-3106.

Pienimaa, S.K. et al., "Stacked Thin Dice Package," Proceedings of the 51st Electronic Components and Technology Conference, 2001, pp. 361-366, IEEE.

Rasmussen, F.E., et al., "Fabrication of High Aspect Ratio Through-Wafer Vias in CMOS Wafers for 3-D Packaging Applications," The 12th International Conference on Solid State Sensors, Actuators and Microsystems, Boston, Jun. 8-12, 2003.

Savastiouk, S. et al., "Thru-silicon interconnect technology," 26th IEEE/CPMT International Electronics Manufacturing Technology Symposium, 2000, abstract.

Schaper, L. et al., "Integrated System Development for 3-D VLSI," Electronic Components and Technology Conference, 2007, ECTC '07, Proceedings, 57th, May 29, 2007-Jun. 1, 2007, pp. 853-857.

Search Report and Writen Opinion issued May 26, 2009 in Singapore Application No. 200706414-0.

Solberg, V., "Innovative 3-D Solutions for Multiple Die Packaging," SMTA International Conference, Sep. 21, 2003.

Takahashi, K. et al., "Current Status of Research and Development for Three-Dimensional Chip Stack Technology," Jpn. J. Appl. Phys., vol. 40 (2001), pp. 3032-3037, Part 1, No. 4B, Apr. 30, 2001, abstract.

Takahashi, K. et al "Through Silicon Via and 3-D Wafer/Chip Stacking Technology," 2006 Symposium on VLSI Circuits Digest of Technical Papers.

Takizawa, T. et al., "Conductive Interconnections Through Thick Silicon Substrates for 3D Packaging," The Fifteenth International Conference on Micro Electro Mechanical Systems, Las Vegas, Jan. 20-24, 2002.

Tezcan, D.S. et al., "Sloped Through Wafer Vias for 3D Wafer Level Packaging," Electronic Components and Technology Conference, 2007, ECTC '07, Proceedings, 57th, May 29, 2007-Jun. 1, 2007, pp. 643-647.

Thomas, D.J. et al., "Etching of Vias and Trenches Through Low k Dielectrics with Feature Sizes Down to 0.1 mm Using M0RIO High Density Plasmas," presented at the 197th Meeting of the Electrochemical Society, Toronto 2000, <http://www.trikon.com/pdfs/ECS2b.pdf>.

Trigas, C., "System-In-Package or System-On-Chip" EE Times, Sep. 19, 2003, <http://www.eetimes.com/story/OEG20030919S0049>.

Vereecken, P.M. et al., "The chemistry of additives in damascene copper plating," IBM J. Res. & Dev., vol. 49, No. 1, pp. 3-18, Jan. 2005.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

XSiL, xise200 for vias and micro-machining, <http://www.xsil.com/products/index/html>, retrieved from the Internet on Aug. 16, 2003.

Yamamoto, S. et al., "Si Through-Hole Interconnections Filled with Au—Sn Solder by Molten Metal Suction Method," pp. 642-645, IEEE, MEMS-03 Kyoto, The Sixteenth Annual International Conference on Micro Electro Mechanical Systems, Jan. 2003, ISBN 0-7803-7744-3.

* cited by examiner

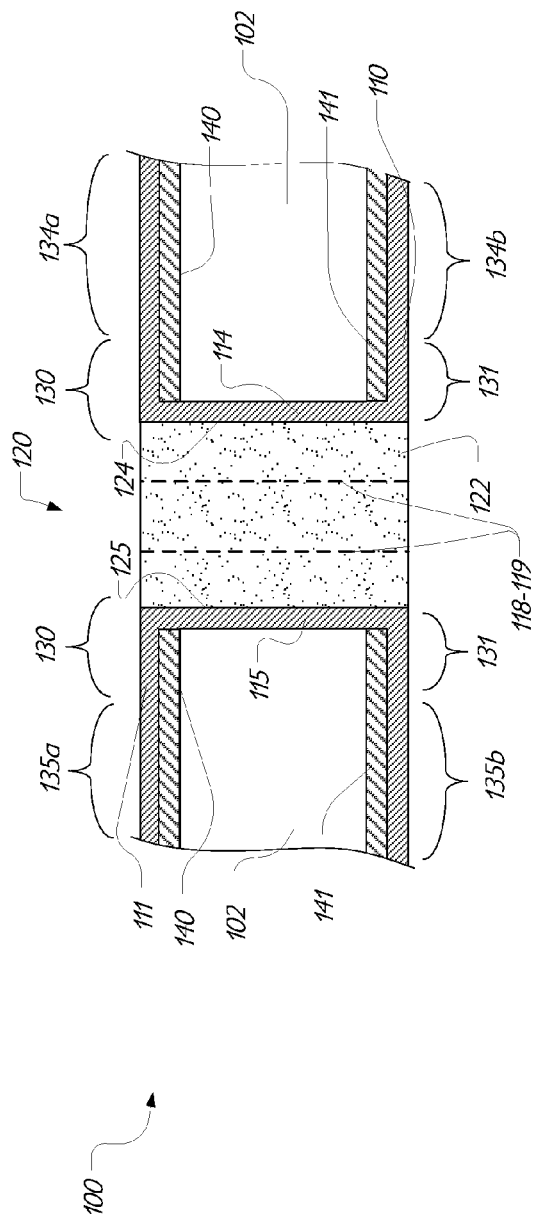
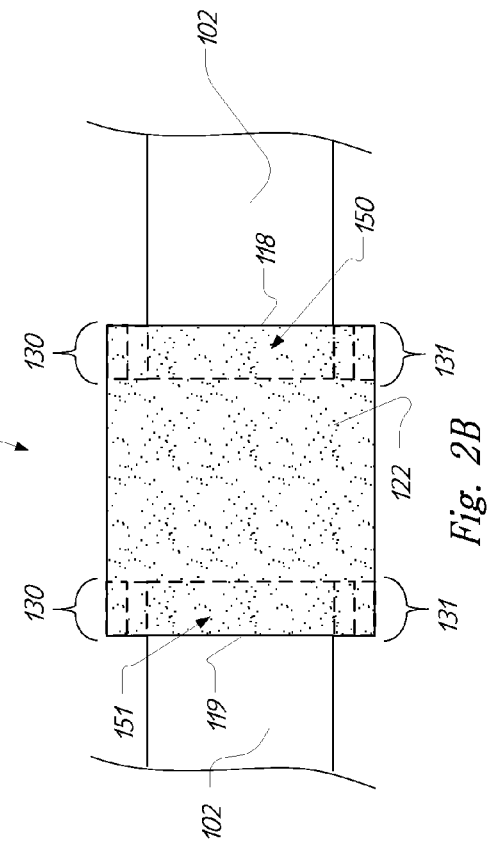

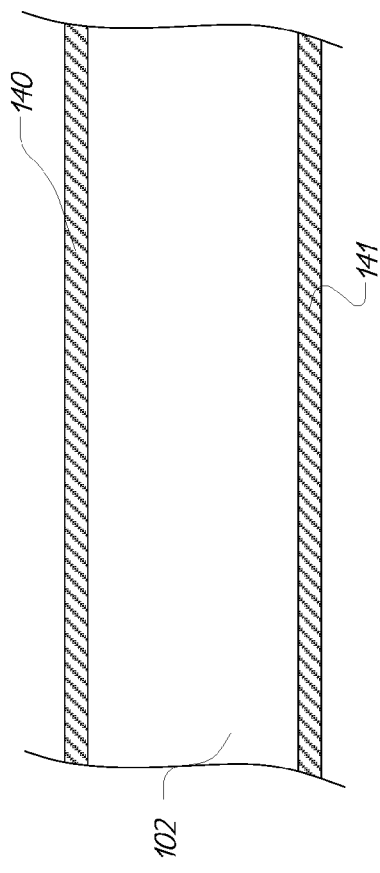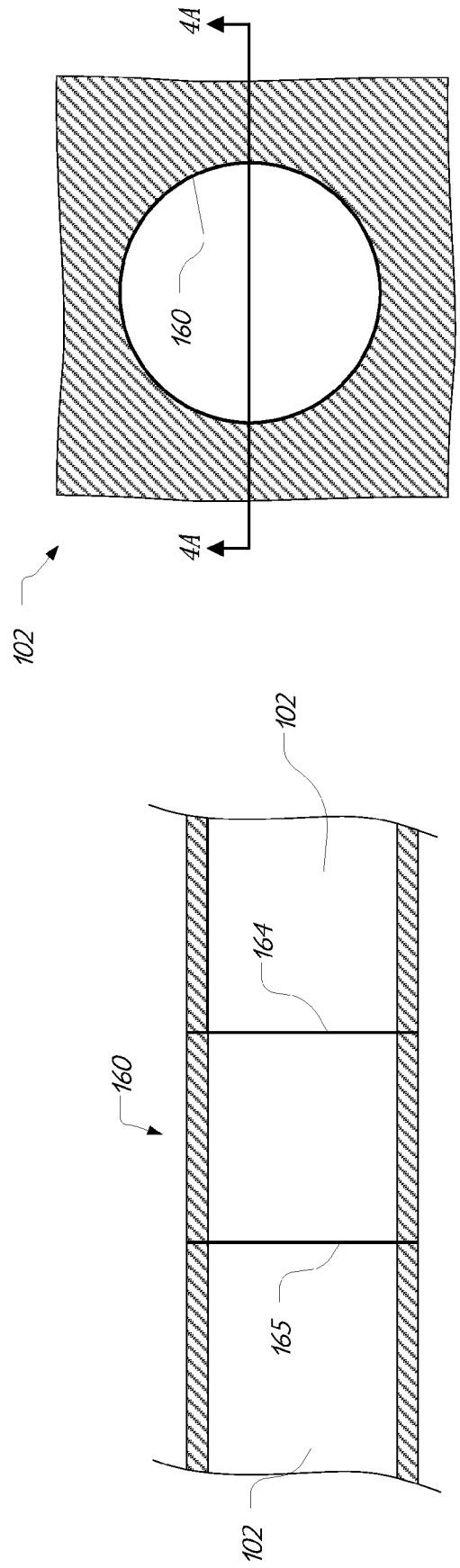

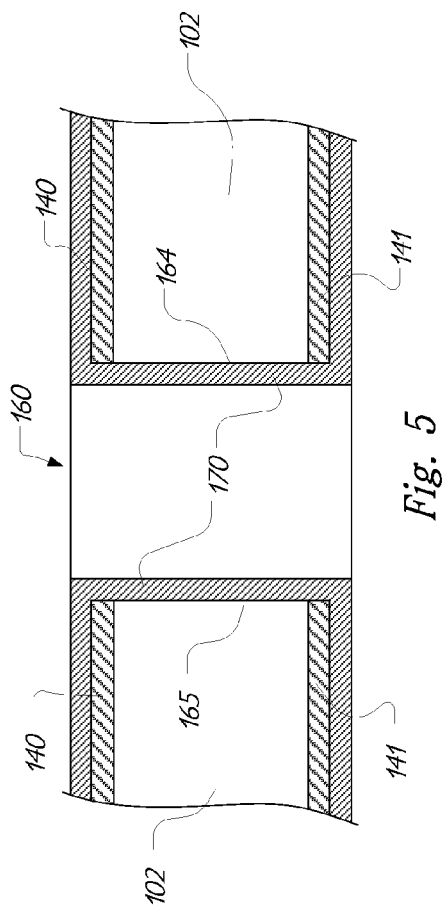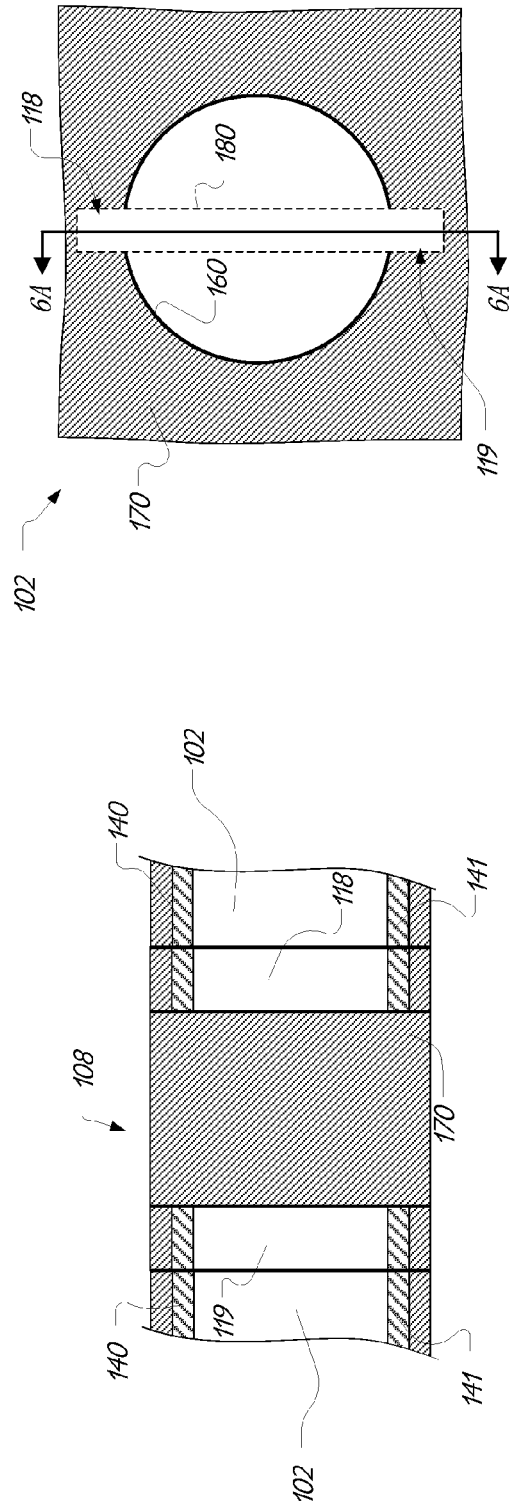

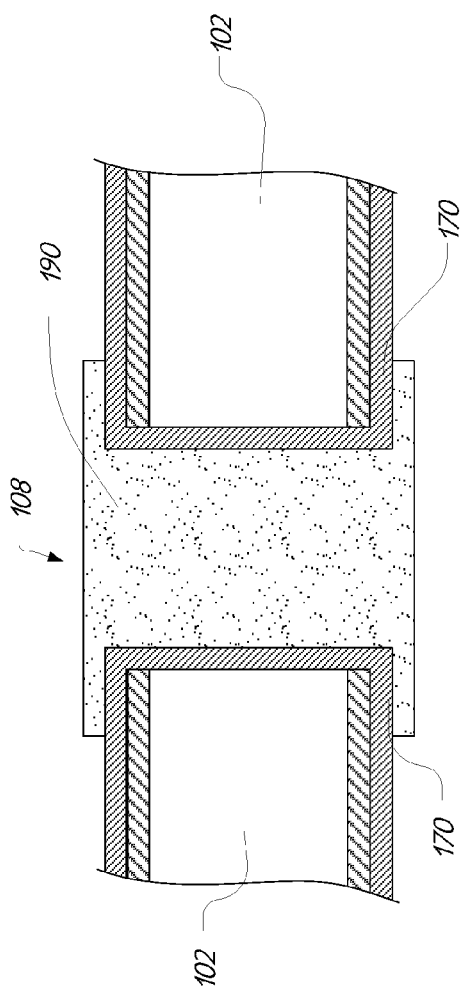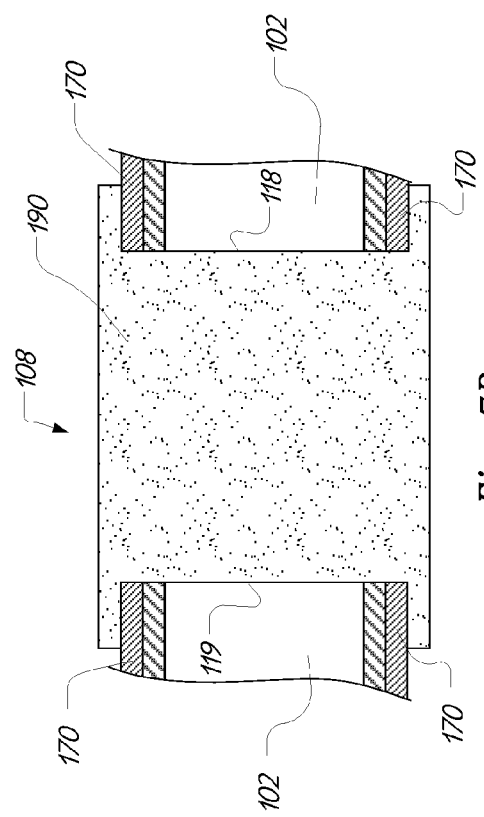

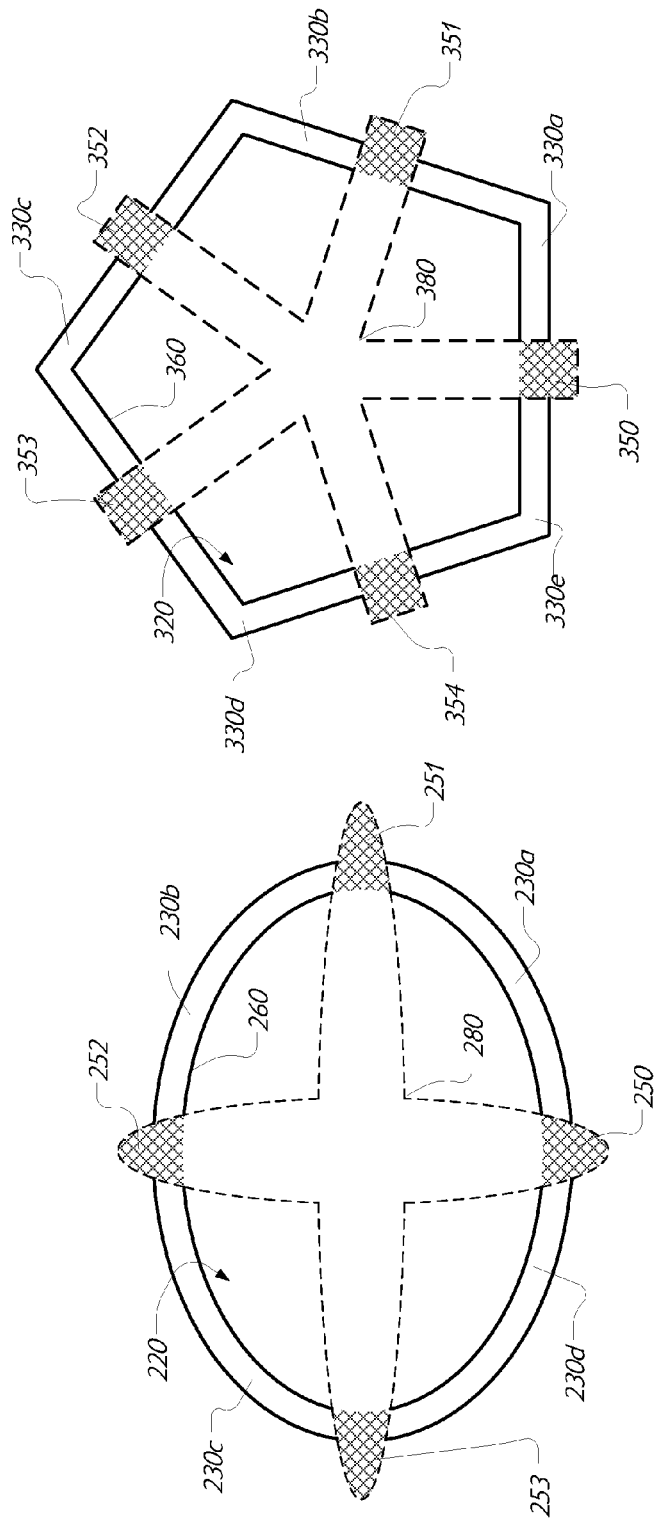
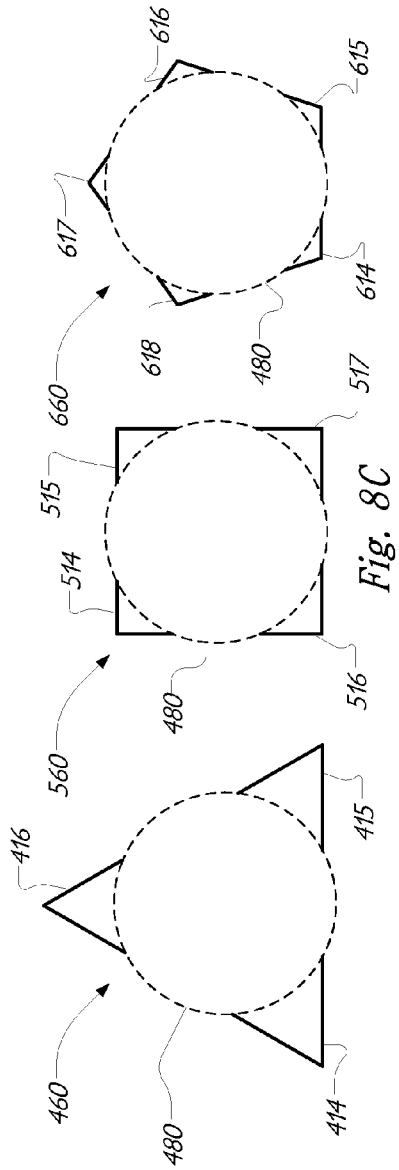
Fig. 8A
Fig. 8B
Fig. 8C

PARTITIONED THROUGH-LAYER VIA AND ASSOCIATED SYSTEMS AND METHODS

CROSS-REFERENCE TO RELATED APPLICATIONS

This application is a divisional of U.S. application Ser. No. 11/863,579 filed Sept. 28, 2007, now U.S. Pat. No. 7,830,018, which claims foreign priority benefits of Singapore Application No. 200706414-0 filed Aug. 31, 2007, now Singapore Patent No. 150410, each of which is incorporated herein by reference in its entirety.

TECHNICAL FIELD

The present disclosure is related to metal vias, interconnects, and other types of patterned contacts formed on a substrate, such as a circuit board layer or a semiconductor wafer.

BACKGROUND

Many electronic systems include a circuit board having an arrangement of electronic components that are attached to the board and dedicated to performing specific electronic functions. For example, a personal computer includes a circuit board that has various types of memory for storing program instructions and a processor for executing the program instructions. In general, a circuit board typically includes a non-conductive layer that is laminated with one or more conductive metal layers. The metal layers include patterned contacts that attach to electrical components and patterned traces that route electrical signals between the patterned contacts.

As electronic systems become smaller and more compact, a large number of closely spaced electrical components are generally mounted to circuit boards. Inevitably, however, it becomes difficult to fit all of the necessary patterned contacts and traces between such closely spaced components. Many electronic systems accordingly use circuit boards that include layers of patterned traces located at multiple levels in the boards. Such multi-level circuit boards include metal vias routed through one or more layers and electrically coupled to one or more levels of the patterned traces. The metal vias can be difficult to locate because they need to avoid electrical contact with most of the patterned traces on a circuit board layer. If a via is not placed correctly, two or more individual traces can inadvertently be shorted together. Consequently, it can be difficult to design and manufacture a circuit board having stacked circuit board layers.

BRIEF DESCRIPTION OF THE DRAWINGS

FIGS. 2A and 2B are cross-sectional side views of the circuit board of FIG. 1 taken along line 2A-2A and line 2B-2B, respectively.

FIG. 3 is a cross-sectional side view of a dielectric layer having metal cladding layers attached at top and bottom sides.

FIG. 4A is a cross-sectional side view of the dielectric layer of FIG. 3 having a first hole that extends between the top and bottom sides.

FIG. 4B is a top view of the dielectric layer of FIG. 4A.

FIG. 5 is a cross-sectional side view of the dielectric layer of FIG. 4A having sidewalls of the first hole lined with a metal plating layer.

FIG. 6A is a cross-sectional side view of the dielectric layer of FIG. 5 having partitions cut into the first hole.

FIG. 6B is a top view of the dielectric layer of FIG. 6A.

FIGS. 7A and 7B are cross-sectional side views of the dielectric layer of FIG. 6A having a via hole filled with a dielectric spacer material.

FIGS. 8A-8C are top views of embodiments of partitioned vias and partitioned lead lands.

DETAILED DESCRIPTION

Various embodiments of partitioned vias, interconnects, and substrates that include such vias and interconnects are described below. The terms "via" and "interconnect" may encompass various types of metal structures that extend at least partially through a non-conductive layer and electrically couple together one or more metal contacts located at a surface of the non-conductive layer. Such metal contacts may be located on the non-conductive layer itself or at another layer that is above or below the non-conductive layer. The term "non-conductive layer" may encompass any of a variety of non-conductive materials (e.g., dielectric materials or semi-conductive materials), which may be included within a substrate. The term "substrate" can include a myriad of electronic and microelectronic structures (e.g., circuit boards or semi-conductor wafers) that physically separate and electrically intercouple electronic or microelectronic components. Electronic and microelectronic components can include any of a wide variety of electrical devices (e.g., transistors, resistors, capacitors, etc.) or systems of such devices (e.g., a processor, a memory, etc.).

To avoid unnecessarily obscuring the description of the various embodiments, the detailed description describes embodiments of partitioned vias and interconnects in the context of circuit board substrates (e.g., a printed circuit board, an etched wiring board, or other type of non-conductive core layer that has been printed, laminated, or otherwise formed to have one or more surfaces of conductive leads, traces, or signal lines). However, alternative embodiments of substrates may comprise other types of semiconductor materials located within a semiconductor wafer (e.g., silicon, silicon dioxide, gallium arsenide, etc.). Likewise, alternative embodiments of vias include metal vias that are located within one or more passivation or inter-level dielectric layers of a microelectronic device. Such vias can also include through silicon vias (TSVs) for electrically intercoupling opposing sides of a silicon substrate. Other embodiments of vias, interconnects, and substrates in addition to or in lieu of the embodiments described in this section may have several additional features or may not include many of the features shown and described below with reference to FIGS. 1-11.

Figure 1:
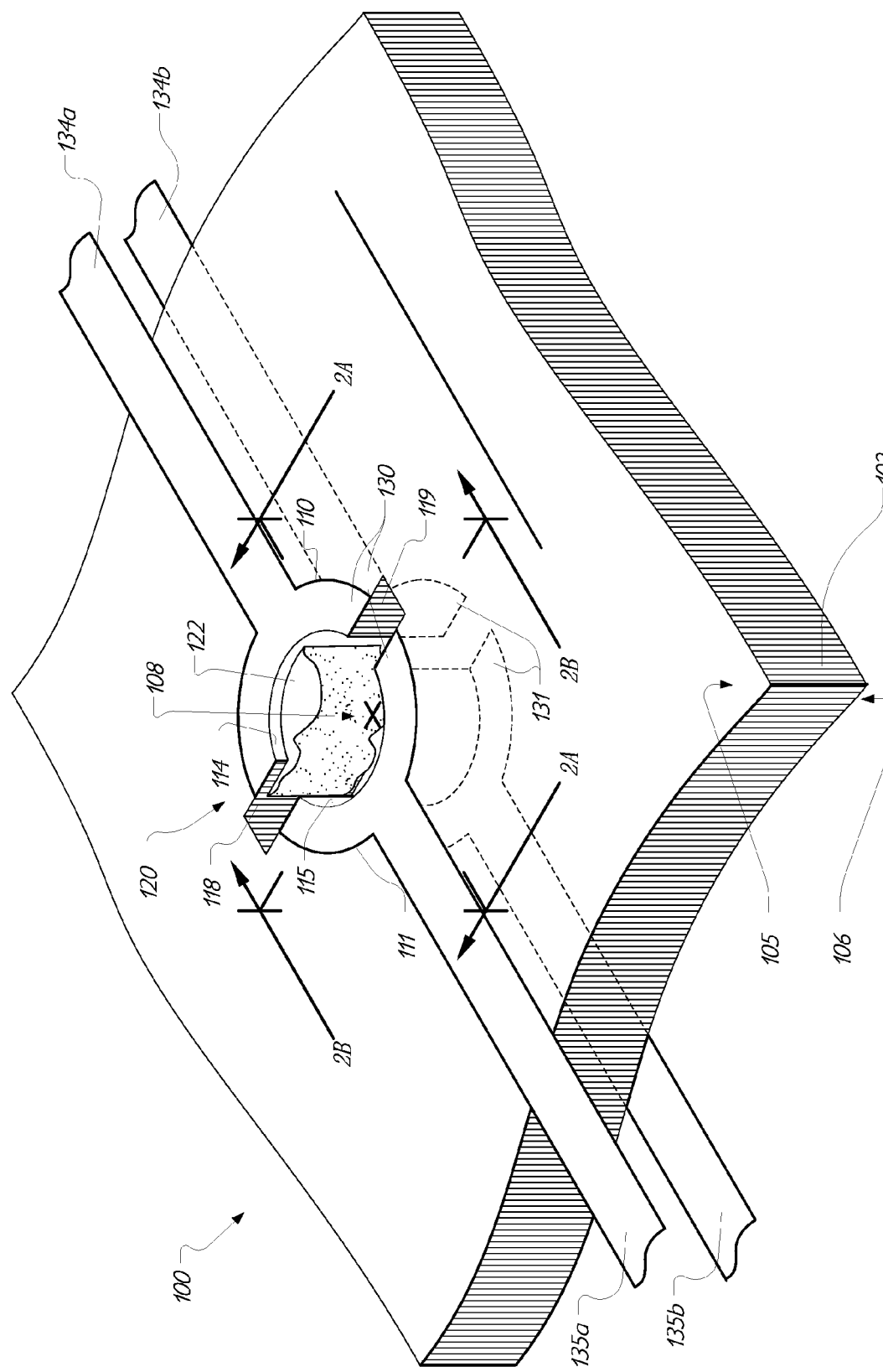
FIG. 1 is an isometric view of a circuit board substrate having a partitioned via configured in accordance with one embodiment of the disclosure.

Turning now to the Figures, FIG. 1 is an isometric view of an embodiment of a portion of a circuit board substrate 100 having a dielectric layer 102 and an embodiment of a partitioned via 120. The dielectric layer 102 can have a top side 105, a bottom side 106, a via hole 108, and first and second interconnects 110-111 within the via hole 108. In many embodiments, the via hole 108 extends between the top and bottom sides 105-106 and includes a first sidewall section covered with a first metal wall plating 114 defining the first interconnect 110 and a second sidewall section covered with a second metal wall plating 115 defining the second interconnect 111. The first and second wall platings 114-115 can be formed from the same layer or "deposit" as explained in more detail below. The via hole 108 can also include first and second partitions 118-119 that bisect the via hole 108 and define a gap that electrically isolates the first wall plating 114 from the second wall plating 115. The first and second partitions 118-119 can have partition walls cut through a metal layer deposited along the sidewall and cut into the dielectric material at the sidewall. The via 120 can further include a dielectric plug 122 or spacer layer that fills the remainder of the via hole 108. The dielectric plug 122 can be attached to portions of the wall platings 114-115 and can also be attached to portions of the partitions 118-119. The dielectric plug 122, for example, can protect the via 120 during subsequent manufacturing (e.g., circuit board layer stacking) and can also provide electrical or mechanical isolation between the wall platings 114-115 and metal lead land portions (described below). In other embodiments, the dielectric plug 122 may be omitted and the via hole 108 can be filled or partially filled with a gas or other type of intermediary material.

In many embodiments, the via 120 is electrically coupled to metal contacts that are located on portions of the top side 105 or the bottom 106 side of the dielectric layer 102. For example, the circuit board 100 can include first and second metal lead lands 130-131, first metal traces 134 (identified individually by reference numbers 134a-b), and second metal traces 135 (identified individually by reference numbers 135a-b). The first lead land 130 and individual first and second traces 134a and 135a are attached at the top side 105 of the dielectric layer 102, and the second lead land 131 and individual first and second traces 134b and 135b are attached at the bottom side 106 of the dielectric layer 102. The lead lands 130-131 are coupled to the wall platings 114-115 of the via 120. More specifically, the first traces 134a-b are connected to the first interconnect 110 via the first and second lead lands 130-131, and the second traces 135a-b are similarly connected to the second interconnect 111 via the first and second lead lands 130-131. In several embodiments, the partitions 118-119 separate a first portion of the lead lands 130-131 that are coupled to the first interconnect 110 from a second portion of the lead lands 130-131 that are coupled to the second interconnect 111. Accordingly, the first traces 134a-b and the second traces 135a-b intercouple opposite sides of the dielectric layer 102 through separate conduction paths that both pass through the via hole 108.

FIG. 2A is a cross-section of FIG. 1 along line 2A-2A illustrating the circuit board 100 and a plated portion of the via 120. This view shows the dielectric layer 102, the via 120, the lead lands 130-131, and the traces 134-135. The dielectric layer 102 can be plated with top- and bottom-side cladding layers 140-141 that are sandwiched between portions of the dielectric layer 102 and the interconnects 110-111. The cladding layers 140-141 and the interconnects 110-111 can have individual patterns that correspond to the shape of individual lead lands 130-131 (e.g., a ring) and individual traces 134-135 (e.g., a line). In several embodiments, the via 120, including the dielectric plug 122, has a general shape that corresponds to the shape of the via hole 108 (FIG. 1). At a first lateral side 124, a portion of the first interconnect 110 (i.e., the first wall plating 114) is at one side of the dielectric plug 122. At a second lateral side 125, a portion of the second interconnect 111 (i.e., the second wall plating 115) is at another side of the dielectric plug 122. The plug 122 has partition regions that are defined by walls of the partitions 118-119 (drawn in phantom) that separate and electrically isolate the wall platings 114-115 from one another (described below).

FIG. 2B is a cross-section of FIG. 1 along line 2B-2B illustrating the circuit board 100 and a non-plated portion of the via 120. The dielectric layer 102 can include the partitions 118-119, which define lateral edges of first and second partition regions 150-151 (drawn in phantom) on the via 120, or more specifically, on the dielectric plug 122. In many embodiments, the partition regions 150-151 are also generally located between and electrically isolate portions of the lead lands 130-131 (also drawn in phantom).

In general, and in contrast to the partitioned via 120, conventional vias occupy a significant amount of surface area on a circuit board layer. Although the vias themselves do not necessarily take up a large area, the lead land that surrounds the via can create a substantial footprint. Each via typically needs to be surrounded by a lead land in order to accommodate an overlap tolerance with a metal contact (e.g., another via) on an above- or below-located circuit board layer. Most conventional circuit board layers typically have design rules that require a minimum lead land diameter corresponding to this overlap tolerance. Such design rules can also establish a preferred spacing distance between individual traces (i.e., to conserve surface area). However, at the portion of the circuit board layer where the individual traces are routed through separate vias, the spacing between individual traces exceeds the preferred spacing because the required diameter of the lead land is much larger than the minimum allowable trace space elsewhere on the board. Consequently, individual traces cannot be routed as close together as desired. This is particularly problematic for electronic components that operate at data transfer rates in the Gigabit-per-second regime or higher because such components generally used differential data transmission techniques over pairs of metal traces that are aligned in parallel and spaced apart from one another. When the parallel traces route through a conventional via, they also divert, increasing their spacing distance. This produces a slight variation in signal path length, which creates a discontinuity in differential impedance.

Several embodiments of the via 120, however, can conserve surface area on a circuit board layer by coupling multiple traces through an individual via hole. For example, the via 120 allows two separate metal traces to be electrically coupled through the circuit board 100 while only occupying a single lead land area. In addition, in other embodiments, three or more metal traces can be routed through a partitioned via. For example, a via hole can be partitioned to have three or more separate sidewall portions that are individually plated with a metal layer. Further, in some embodiments, partitioned vias allow traces to be aligned in parallel without having to divert to separate vias. Such traces can be separated from each other by a fixed spacing distance and thus can allow electronic components to communicate differentially without impedance discontinuities (see, e.g., FIG. 9).

FIGS. 3-7B illustrate stages of forming the partitioned via 120 in accordance with several embodiments of the disclosure. FIG. 3 is a cross-sectional side view of the dielectric layer 102 and the cladding layers 140-141. In many embodiments, the dielectric layer 102 includes a core material (e.g., G10/FR4 or other type of epoxy or glass based material) and the cladding layers 140-141 include a conductive material (e.g., copper, gold, or other type of cladding material that can be plated, laminated, or otherwise bonded). In several embodiments, the dielectric layer 102 can be part of a support base for a double-sided circuit board or be included in a stack of single- or double-sided circuit board layers. In other embodiments, and depending on how the dielectric layer 102 is used, one or more of the cladding layers 140-141 can be omitted (e.g., if the dielectric layer 102 is used as a single-sided circuit board layer).

FIG. 4A is a cross-sectional side view of the dielectric layer 102 after forming a first hole 160, including a sidewall with first and second sidewall portions 164-165, by a first patterning process. FIG. 4B is a top-view of the dielectric layer 102 showing a shape (i.e., a circle) of the first hole 160. The first patterning process removes dielectric material from the dielectric layer 102 and can include mechanical drilling, laser drilling, or mechanical stamping through the dielectric layer 102. Mechanical drilling processes use an automated drilling machine having a drill bit that forms holes in the dielectric layer at pre-programmed locations. Laser drilling processes pattern a dielectric layer in a similar fashion, but instead use a laser in lieu of a drill bit. The laser ablates portions of the dielectric layer and thus creates relatively smaller holes than mechanically drilled holes. Mechanical stamping processes can also be automated and include the use of a stamping machine or punch tool. The stamping machine punches out dielectric material from the dielectric layer 102, leaving a patterned void in the dielectric layer 102. Other patterning processes can include various types of wet or dry chemical etching techniques and corresponding lithographic patterning and development steps. For example, in embodiments that comprise semiconductor based substrates, the first patterning processes may incorporate the well developed chemical etching and lithography techniques of the semiconductor arts. Also, in other embodiments, the first patterning process can be omitted. The dielectric layer 102, for example, can be a substrate that has been pre-fabricated and includes individual pre-formed holes corresponding to the shape of the first hole 160.

FIG. 5 is a cross-sectional side view of the dielectric layer 102 after forming a metal plating layer 170 that covers the sidewall portions 164-165 of the first hole 160. The plating layer 170 can be a material such as copper, aluminum, or an alloy of the two that is deposited onto the sidewall portions 164-165. The plating layer 170 can be formed using a process such as electroplating, electroless plating, or other types of thin film deposition techniques (e.g., physical and chemical vapor deposition). In several embodiments, the plating layer 170 also covers at least one of the cladding layers 140-141. Stacked portions of the plating layer 170 and the cladding layers 140-141, for example, can be used to form the lead lands 130-131 and traces 134-135 (see, e.g., FIGS. 2A-B).

FIG. 6A is a cross-sectional side view of the via hole 108 in the dielectric layer 102 formed by cutting the partitions 118-119 in the first hole 160 using a second patterning process. FIG. 6B is a top view of the dielectric layer 102 showing a shape of the partitions 118-119 (e.g., rectilinear) of a partitioned via. The partitions 118-119 generally correspond to sections where the second patterning process has removed portions of the plating layer 170 from the first hole 160. In many embodiments, the second patterning process further removes dielectric material from the dielectric layer 102. The second patterning process can also remove portions of the plating layer 170 and the cladding layers 140-141 from top- and bottom-side portions of the dielectric layer 102 that are adjacent to the partitions 118-119. In several embodiments, the second patterning process can be similar to the first patterning process, but the second pattering process augments the first hole 160 to have a definable boundary between the sidewall portions 164-165. For example, any one of mechanical drilling, laser drilling, mechanical stamping, or chemical etching can be used to augment the first hole 160 by removing the portions of the plating layer 170 or dielectric material from the dielectric layer 102.

FIGS. 7A and 7B are cross-sectional side views of the dielectric layer 102 after filling the via hole 108 with a dielectric spacer material 190. The dielectric spacer material 190 may be a non-conductive ink that is held by surface tension to the plating layer 170 and the walls of the partitions 118-119. In other embodiments, the dielectric spacer material 190 is a conformal and non-conductive film that is deposited or otherwise formed in the via hole 108.

Returning to FIGS. 2A and 2B, after the via hole 108 has been filled, excess dielectric material 190 can be etched, compressed, planarized, or otherwise removed from top- or bottom-side surfaces of the dielectric layer 102. Also, the plating layer 170 and the cladding layers 140-141 can be patterned to form the lead lands 130-131 and the traces 134-135. The dielectric layer 102, for example, may be covered in a photolithographic film that is patterned, developed, and subsequently etched to create the shape of the leads lands 130-131 and the traces 134-135 (e.g., via a wet or dry etch).

Embodiments of the partitioned via 120 can have any of a wide variety of different shapes that can be adapted by modifying the shape of the via hole 108. FIG. 8A is a top view of an embodiment of an elliptical via 220 having a plurality of elliptically segmented lead lands 230a-d. An elliptically shaped hole 260 and partition cuts using a cross-shaped cutting pattern 280 can form four separate partition regions 250-253 between the lead lands 230a-d. In this embodiment, the via 220 can route up to four separate electrical connections through a circuit board layer via the lead lands 230a-d. As another example, FIG. 8B is top view of a via 320 having a plurality of lead land 330a-d that have a pentagon shape. A pentagon shaped hole 360 and a branched cutting pattern 380 can form five separate partition regions 350-354 electrically separating the lead lands 330a-e. Accordingly, the partition regions 350-354 allow up to five electrical connection to be routed through the via 320. In other embodiments, the vias and lead lands may have other types of circular, elliptical, polygonal shapes (e.g., a triangle, a square, a hexagon, etc.), or combinations thereof. In addition, different combinations of patterning processes can be used to create a desired hole shape or number of wall platings along the hole shape. For example, FIG. 8C shows top views of a triangular hole 460, a square hole 560, and a pentagon hole 660 that have been formed by a mechanical stamping process. Using the same circular drill (e.g., mechanical or laser), a second patterning process can create a circular augmentation 480 that yields three separate wall platings 414-416 in the triangular hole 460, four separate wall platings 514-517 in the square hole 560, and five separate wall platings 614-618 in the polygon hole 660.

Figure 9:
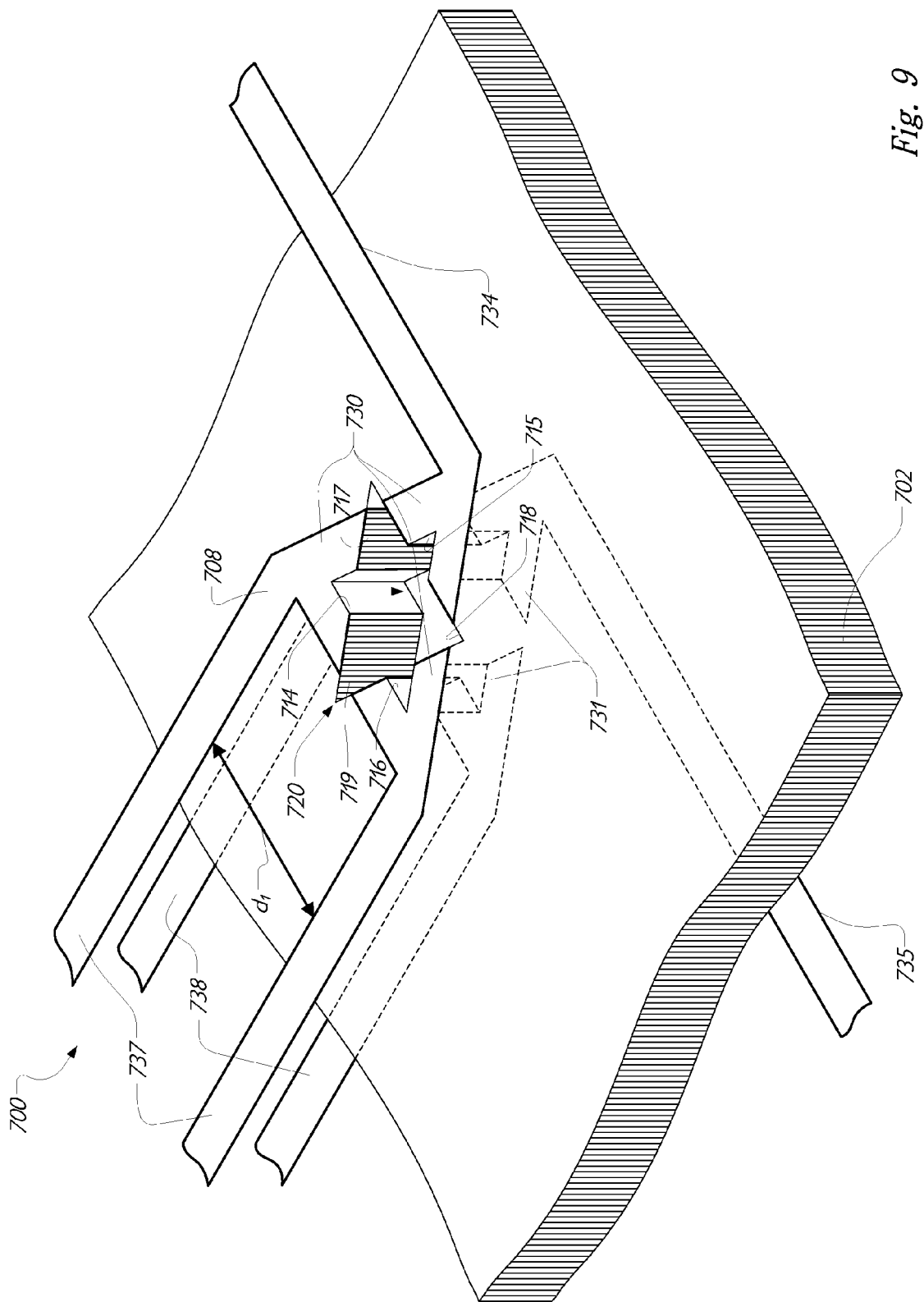
FIG. 9 is an isometric view of a circuit board layer having a partitioned via coupled to individual traces and sets of parallel traces.

Embodiments of partitioned vias can also allow for a variety of configurations of traces, lead lands, and other contacts to be separately routed through a common via hole. For example, FIG. 9 is an isometric view of a portion of a circuit board layer 700 having a dielectric layer 702 and an embodiment of a triangular shaped via 720. The dielectric layer 702 can include a star shaped via hole 708 that includes partitions 717-719. The via 720 can include metal wall platings 714-716 that are separated by individual partitions 717-719, and may further include a dielectric plug (not shown). The via 720 may also be at least partially surrounded by triangular shaped metal lead lands 730-731 that are located at opposite sides of the dielectric layer 702. In this example, the via 720 can electrically intercouple individual metal traces 734-735 and sets of parallel metal traces 737-738, which are separated from each by a fixed distances $d_1$. Notably, the fixed distance $d_1$ does not increase when the sets of traces 737-738 route through the via hole 708 (mitigating variations in differential impedance). Accordingly, two or more electronic components can be electrically coupled together in a single-ended fashion using the individual traces 731-732 or differentially using the sets of traces 737-738. The electronic components, for example, may be attached to opposite sides of the circuit board layer 702.

Figure 10:
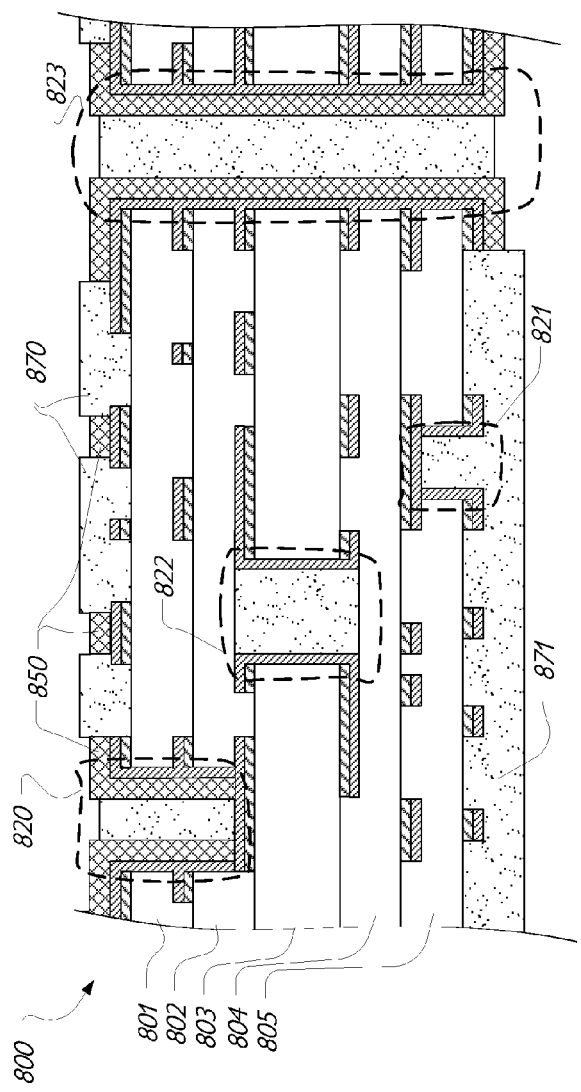
FIG. 10 is a cross-sectional side view of a stack of individual circuit board layers that includes individual partitioned vias.

In other embodiments, an individual circuit board layer or a stacked system of such circuit board layers may include one or more embodiments of a partitioned via. FIG. 10 is a cross-sectional side view of a circuit board system 800 having individual circuit board layers 801-805 or stacking layers that are intercoupled by one or more partitioned vias 820-823. The stacking layers 801-805 have individual surfaces that include traces, lead lands, and other metal contacts that are electrically coupled to an above- or below-located stacking layer through one or more of the vias 820-823. Individual vias can be formed, for example, by removing dielectric material from one or more of the stacking layers 801-805 and creating a via hole that extends through at least one of the stacking layers or towards one or more of the metal contacts located at any one of the stacking layers. For example, the vias 820-821 are "blind" vias that are aligned with metal contacts that are located at the circuit board layers 801 and 803, respectively. The via 822 is a "buried" via sandwiched between the circuit board layers 802 and 804. The via 823 is a "through-hole" via that electrically intercouples the top and bottom sides of the system 800. In several embodiments, the system 800 can further include dielectric laminating layers 870-871 at the top and bottom sides of the system. Portions of the laminating layers 870-871 may expose electrical contacts that can include a gold and/or nickel plating layer 850 (to prevent rapid oxidation of copper based cladding and plating layers). In many embodiments, a variety of electronic or microelectronic components are attached to the top or bottom sides of the system 800. An electronic component, for example, may have one or more contacts that are electrically coupled to any one of the exposed contacts of the system 800 (e.g., by wire bonding or soldering). In other embodiments, the system 800 includes more or fewer circuit board layers.

Figure 11:
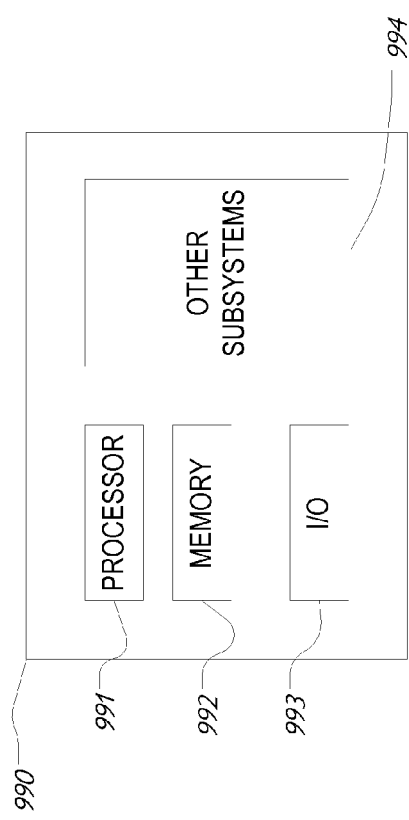
FIG. 11 is a schematic illustration of a system in which a partitioned via may be incorporated.

Any one of the partitioned vias or corresponding circuit board layers described above with reference to FIGS. 1-10 can be incorporated into any of a myriad of larger or more complex systems 990, a representative one of which is shown schematically in FIG. 11. The system 990 can include a processor 991, a memory 992 (e.g., SRAM, DRAM, Flash, or other memory device), input/output devices 993, or other subsystems or components 994. Electronic devices may be included in any of the components shown in FIG. 11. The resulting system 990 can perform any of a wide variety of computing, processing, storage, sensor, imaging, or other functions. Accordingly, representative systems 990 include, without limitation, computers or other data processors, for example, desktop computers, laptop computers, Internet appliances, hand-held devices (e.g., palm-top computers, wearable computers, cellular or mobile phones, personal digital assistants), multi-processor systems, processor-based or programmable consumer electronics, network computers, and minicomputers. Other representative systems 990 include cameras, light or other radiation sensors, servers and associated server subsystems, display devices, or memory devices. Components of the system 990 may be housed in a single unit or distributed over multiple, interconnected units, e.g., through a communications network. Components can accordingly include local or remote memory storage devices and any of a wide variety of computer-readable media.

From the foregoing, it will be appreciated that specific embodiments have been described herein for purposes of illustration, but well-known structures and functions have not been shown or described in detail to avoid unnecessarily obscuring the description of the embodiments. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. It will also be appreciated that specific embodiments have been described herein for purposes of illustration but that various modifications may be made within the claimed subject matter. For example, many of the elements of one embodiment can be combined with other embodiments in addition to, or in lieu of, the elements of the other embodiments. Accordingly, the invention is not limited except as by the appended claims.

I claim:

1. A method for manufacturing a substrate, the method comprising:
    forming a hole through a non-conductive layer, the hole including a sidewall;
    after forming the hole, depositing a conductive layer on at least a portion of the sidewall and at least one of a top-side and a bottom-side of the non-conductive layer; and
    forming partitions within the hole that separate the conductive layer into a first interconnect within the hole and a second interconnect within the hole that is electrically isolated form the first interconnect.

2. The method of claim 1 wherein the non-conductive layer comprises at least one of a dielectric core layer of a circuit board and a semiconductor layer of a semiconductor wafer.

3. The method of claim 1 wherein forming the hole and the partitions comprises removing conductive material from the conductive layer using a patterning process that includes at least one of chemical etching, mechanical drilling, laser drilling, and mechanical stamping.

4. The method of claim 1, further comprising at least partially filling the hole with a dielectric spacer material.

5. The method of claim 1 further comprising:
    forming a lead land on at least one of a top-side portion and a bottom-side portion of the conductive layer, the lead land at least partially surrounding the hole and including first and second segmented portions, the first segmented portion being electrically coupled to the first interconnect and the second segmented portion being electrically coupled to the second interconnect and electrically isolated from the first interconnect.

6. The method of claim 5 further comprising forming a first trace on at least one of the top-side and bottom-side portions of the conductive layer, the first trace being electrically coupled to the first segmented portion of the lead land.

7. The method of claim 6 further comprising forming a second trace on at least one of the top-side and bottom-side portions of the conductive layer, the second trace being electrically coupled to the second segmented portion of the lead land.

8. The method of claim 7 wherein the first and second traces are located on the same side of the non-conductive layer and are substantially parallel to one another.

9. The method of claim 1 wherein forming the hole further includes forming the hole through a portion of a stacking layer that is attached to the non-conductive layer.

10. A method for manufacturing a substrate, the method comprising:

forming a via hole through a non-conductive material having a first side opposite a second side, the via hole including a sidewall extending between the first side and the second side;

after forming the hole, depositing a conductive material on at least a portion of the sidewall, the first side, and the second side of the non-conductive material;

forming partitions within the via hole that separate the conductive material into a first interconnect and a second interconnect within the via hole, the first and second interconnects being electrically isolated from each other; and patterning the conductive material on the first and second sides of the non-conductive material to form first and second lead lands electrically isolated from each other and in direct contact with the first and second interconnects, respectively; and first and second traces in electrical contact with and extending away from the first and second lead lands, respectively.

11. The method of claim 10 wherein the non-conductive layer comprises at least one of a dielectric core layer of a circuit board and a semiconductor layer of a semiconductor wafer.

12. The method of claim 10 wherein forming the via hole and the partitions comprises removing a portion of the conductive material using a patterning process that includes at least one of chemical etching, mechanical drilling, laser drilling, and mechanical stamping.

13. The method of claim 10, further comprising at least partially filling the hole with a dielectric spacer material.

14. The method of claim 10, further comprising forming third and fourth lead lands on the second side of the non-conductive material, the third lead land being electrically coupled to the first interconnect and the fourth lead land being electrically coupled to the second interconnect.

* * * * *

UNITED STATES PATENT AND TRADEMARK OFFICE
CERTIFICATE OF CORRECTION

PATENT NO. : 8,367,538 B2  
APPLICATION NO. : 12/898891  
DATED : February 5, 2013  
INVENTOR(S) : Lee Teck Kheng Page 1 of 1

It is certified that error appears in the above-identified patent and that said Letters Patent is hereby corrected as shown below:

On Title Page, Item (57), under "Abstract", column 2, line 7, after "first section" insert -- and --.

Signed and Sealed this  
Thirtieth Day of April, 2013

Teresa Stanek Rea  
*Acting Director of the United States Patent and Trademark Office*